United States Patent [19]

Smart

[11] 3,735,467

[45] May 29, 1973

[54] FORM-CRIMPING APPARATUS FOR THE MANUFACTURE OF ELECTRICAL COMPONENTS

[75] Inventor: Ernest F. Smart, Horseheads, N.Y.

[73] Assignee: Westinghouse Electric Corporation, Pittsburgh, Pa.

[22] Filed: May 25, 1971

[21] Appl. No.: 146,750

[52] U.S. Cl. ....................29/203 D

[51] Int. Cl. ....................H01r 43/04

[58] Field of Search ....................29/203 D, 203 R, 29/203 DT, 203 S, 203 B

[56] References Cited

UNITED STATES PATENTS 3,428,843 2/1969 Keller ....................29/203 D

*Primary Examiner*—Thomas H. Eager

*Attorney*—F. H. Henson and C. F. Renz

[57] ABSTRACT

An apparatus for the manufacture of electronic components and more particularly in the electronic tube art wherein bell-shaped eyelet shield members are threaded on and positioned accurately on stem lead members of an assembly used in electronic tubes. This is accomplished by the provision of a plurality of holding cavities for supporting and positioning the eyelet members and providing easy insertion of the stem lead members into the eyelets. In addition, means is provided for accurately positioning the stem with respect to the eyelet holding cavities and crimping means is provided for securing the eyelet to the stem lead wherein a force is simultaneously applied to opposite sides of a portion of the eyelet members to crimp the eyelet members to the stem lead without the undesirable forces being applied to the stem lead assembly. Orientation cavities are provided for leading the eyelets into the holding cavities.

6 Claims, 5 Drawing Figures

FORM-CRIMPING APPARATUS FOR THE MANUFACTURE OF ELECTRICAL COMPONENTS

BACKGROUND OF THE INVENTION

In many types of electronic tubes, the electrode leads are brought out of the tube envelope through a glass portion of the envelope commonly referred to as the stem base. The leads or stem leads extend through the stem base and are sealed into this stem base. During the manufacture and the later operation of the electronic tube, metal vapors and other electrically conductive material may condense on the interior surface of the stem base and in time may build up an electrically conductive or leakage path between adjacent steam leads. To prevent the formation of the conductive leakage path between these stem leads, it is common practice to provide shield members in the form of an eyelet threaded on the stem leads and secured to the stem leads adjacent to the stem base surface to provide a shadowing effect and thereby prevent the condensation of materials on the surface surrounding the stem leads. These shield members normally take the form of a bell-shaped type configuration eyelet member which has an upper small portion which is normally secured to the stem lead. The lower flared-out portion of the eyelet member normally extends downwardly in over-hanging relation to the entrance portion of the stem lead into the envelope from the stem member.

One of the problems associated with the positioning of these eyelets on the stem leads is that there are normally a plurality of stem leads and these eyelets should all be substantially equally spaced from the stem base. It is important that a minimum distortion to the stem lead and the flared portion of the bell-shaped shield occurs during the assembly operation. It is also important that the method of securing the eyelet to the stem lead will be such as to not loosen in any subsequent processing or operation of the tube. It is also important there there not be any damage to the glass stem base during the joining operation of the eyelets to stem assembly.

Present techniques in the art are normally a simple hand operation wherein the eyelet is slipped or threaded over the stem lead and the operator secures the eyelet to the stem lead either by crimping or a welding operation. It is found that in this type of operation that the operator will quite often bend the stem leads resulting in glass damage and possibly weaken the stem member. It is also quite difficult for the operator to provide substantial equal spacing of all the eyelets with respect to the base of the stem member. In most applications, only a few of the stem leads in the assembly may be used and therefore it is unnecessary to provide a shield on the unused stem leads. It is almost impossible for an operator to identify and select the proper stem leads.

SUMMARY OF THE INVENTION

This invention is directed to an apparatus for providing accurate location of shield members on stem leads on a stem assembly as used in electronic tube art. The apparatus comprises an orientation plate member having a plurality of cavities positioned to conform to the configuration arrangement of the stem leads in the stem assembly. Each of the cavities is adapted to permit insertion of the stem leads. A first group of cavities which may be referred to as holding cavities also permit insertion of the eyelet with the small end extending down below the bottom surface of the plate and the flared portion resting on a locating surface recessed below the upper surface of the plate member. A second group of cavities, which may be referred to as non-holding cavities, do not permit insertion of the eyelets. The plate member is located in a horizontal plane and the small end or crimping portion eyelet members will lie within a plane below the lower surface of the plate member. The stem leads of the stem assembly are then inserted through the eyelets located in the holding cavities and through the non-holding cavities and means is provided for providing the desired spacings of the eyelets with respect to the base of the stem assembly. A crimping apparatus, located below the plate member, is comprised of an inner and outer circular collet with collet segments provided for each of the stem leads. The stem lead is positioned between an inner and an outer collet segment. Mechanical means is provided for forcing the two collets toward each other simultaneously so as to engage the small end or crimping portion of the eyelet and crimping this portion of the eyelet to the stem leads of the stem assembly. The upper surface of the plate member is provided with orientation cavities to permit ease of loading the eyelets into the holding cavities.

BRIEF DESCRIPTION OF THE DRAWINGS

For a better understanding of the invention, reference may be had to the preferred embodiment, exemplary of the invention, shown in the accompanying drawings, in which.

DESCRIPTION OF THE PREFERRED EMBODIMENTS

Figure 1:
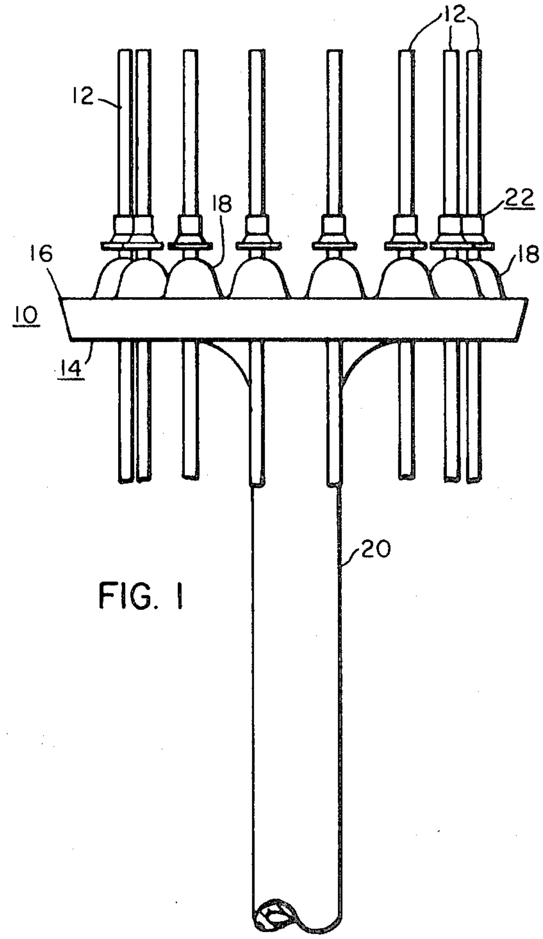
FIG. 1 is a view of a stem assembly with eyelet members secured to the stem leads in accordance with the teachings of this invention.

FIG. 1 illustrates a stem assembly 10 and is comprised of a stem base 14 and a tubulation 20 of a suitable insulating material such as glass. A plurality of elongated wire-like members or stem leads 12 of a suitable electrically conductive material such a nickel are sealed through the base portion 14. The specific stem assembly 10 shown herein is designed for a color television tube and is comprised of 14 stem leads. Ten of the stems are used and 4 are not used in supplying voltage to the tube. The interior surface 16 of the base portion is provided with a fillet or boss 18 of glass which surrounds each stem lead 12 and locally thickens the base portion 14 in the region where the stem lead 12 passes through the base 14. The stem assembly 10 is normally sealed into an envelope at the outer periphery of the base portion 14 and the tubulation 20 is used for exhaust of the envelope and is tipped off after processing of the tube. The diameter of the stem leads 12 may be about 0.30 inch.

A tubular member or generally bell-shaped shield member 22 is provided on each stem lead 12 and is spaced from and overhangs the boss portion 18. The shield member 22 may be of a suitable material such as stainless steel and having a thickness of about 0.005 inch. The shield member 22 includes an upper portion 24 which is the small or crimping portion of the bell-shaped eyelet member 22 and has an internal diameter substantially the same as the outer diameter of the stem lead 12. For example, the diameter of the stem lead 12 may be of about 0.030 inch. The small end 24 of eyelet 22 may have an internal diameter of about 0.034 inch. The shield 22 includes a flared or tapered portion 26 which extends downwardly and outwardly and includes an out turned flange 28. The diameter of the eyelet 22 at the outer periphery of the flange 28 is about 0.140 inch. The larger end of the tapered portion 26 may be about 0.075 inch.

Figure 2:
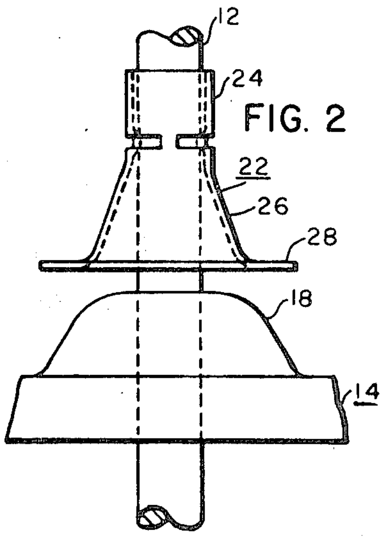
FIG. 2 is an enlarged view of one of the stem leads with associated eyelet as shown in FIG. 1 and illustrating the crimping deformation of the eyelet member.

As can easily be seen from FIG. 2, the evaporation of any materials in the processing and manufacture of the tube will condense on the upper surface of the shield 22 and will be prevented from landing on the surface of the boss 18 surrounding the lead 12 and beneath the shield member 22. A conventional application of the stem assembly 10 illustrated in FIG. 1 is in a cathode ray tube wherein it is sealed in to the neck portion of the cathode ray tube.

Figure 4:
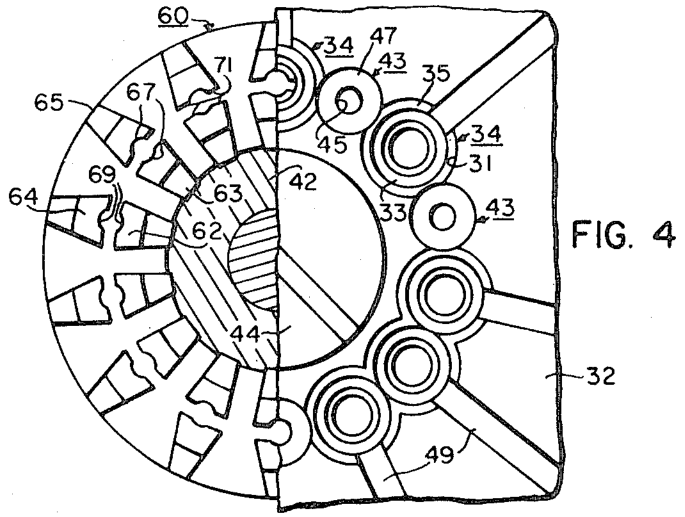
FIG. 4 is a top view of a portion of the assembly in FIG. 3 with a portion of the plate member removed to illustrate the collet assembly.
Figures 3, 5:
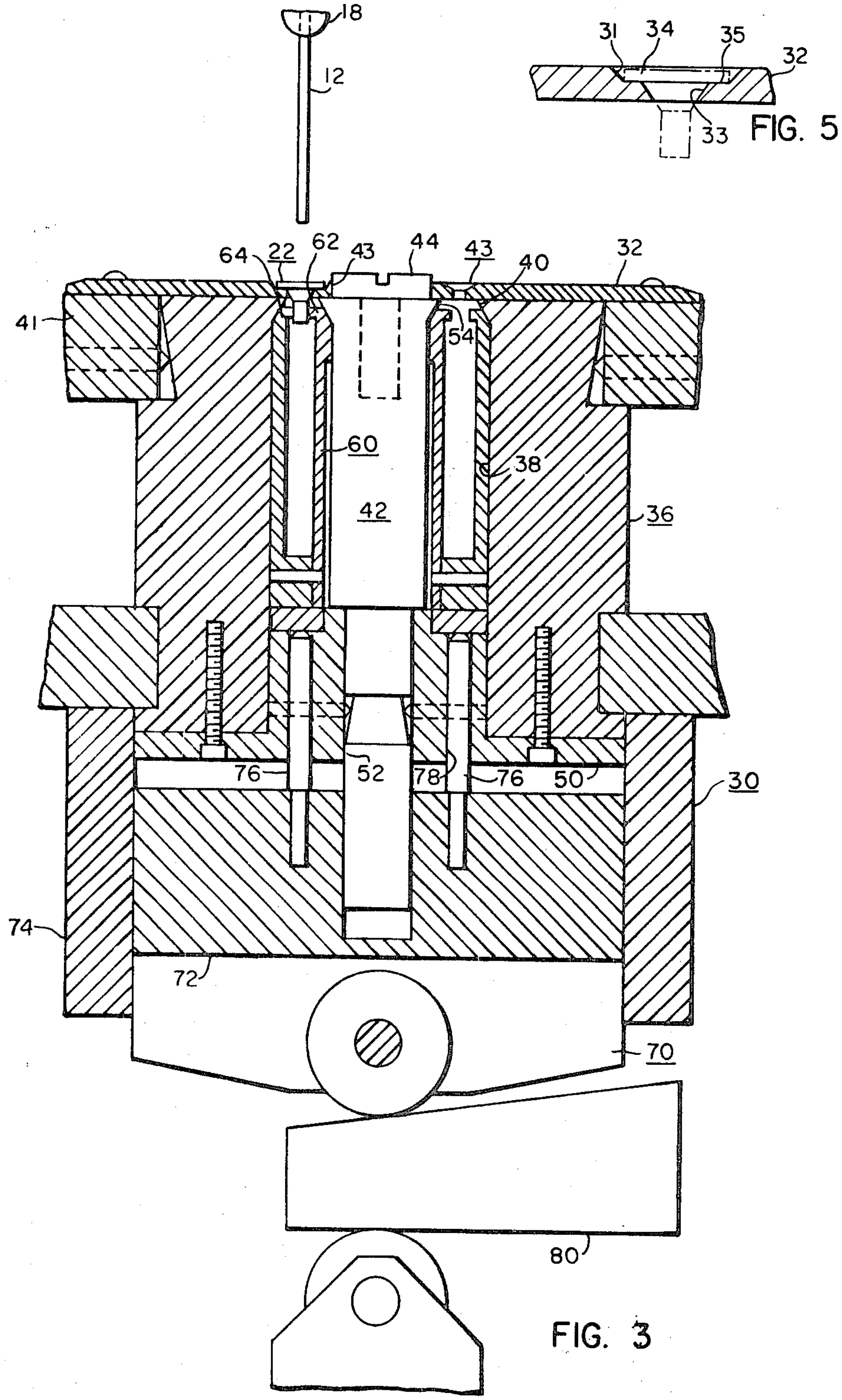
FIG. 3 is a sectional view of an apparatus for securing the eyelets to the stem leads of a stem assembly in accordance with the teachings of this invention.
FIG. 5 is an enlarged sectional view taken along line V—V of FIG. 3.

FIGS. 3, 4 and 5 illustrate apparatus for providing the form crimping assembly of eyelets 22 to the stem leads 12 such as shown in FIGS. 1 and 2. A form crimping apparatus 30 is illustrated in FIGS. 3 and 4 and comprises an orientation plate member 32 having a plurality of cavities 34 and 43 arranged in a circle to conform to stem lead pin-circle in the stem assembly 10. The plate member 32 may be mounted to a table top 41. The holding cavities 34 have an upper portion 31 of a diameter of about 0.218 inch and a lower portion 33 of a diameter of about 0.085 inch. The sides of the portions 31 and 33 may be tapered. The eyelet 22 is brushed or dropped into the cavity 32 as illustrated in FIG. 3 and 5 and the stem leads are then inserted into the eyelets 22 and the cavities 32. The holding cavity 34 has a shoulder portion 35 between the upper portion 31 and the lower portion 33 on which the flange 28 is seated. The taper dimensions on the outer diameter of the flared portion 26 of the eyelet 22 may be about 0.075 inch at the larger end adjacent the flared portion 28 and about 0.045 inch adjacent the crimping portion 24 of the eyelet 22. When the eyelet 22 is positioned into the holding cavity 34, the flared portion 28 rests on shoulder 35 and is recessed below the upper surface of the plate 32. The cavities 43 as shown in FIG. 3 have a lower portion 45 which is of a diameter of about 0.040 inch with an upper tapered portion 47. The dimensions are such that the cavities 43 will not receive or hold the eyelet 22 but will permit insertion of the stem leads 12. In this manner, the eyelets 22 are positioned in only cavities 34 into which only the active stem leads 12 are inserted.

Also provided on the upper surface of the plate member 32 is a plurality of orienting cavities or guide grooves 49 in which a groove 49 connects with each cavity 34. Their orienting cavities 49 have a width of about 0.025 inch and a depth of about 0.025 inch. This configuration of cavities 34 and 41 and orienting cavities 49 permits the operator to place a plurality of eyelets on the upper surface of the plate 32 and easily sweep, brush or vibrate the eyelets 22 into the cavities 34 and then remove any excess eyelets 22. The advantages of this configuration are obvious.

The plate member 32 is secured to a collet holder member 36. The collet holder 36 includes a central opening 38. The central opening 38 has a diameter of about 0.920 inch and the region of the opening 38 adjacent to the plate 32 tapers inwardly to provide a first wedging surface 40. An arbor member 42 is also positioned within the opening 38 and is cylindrical in shape having a diameter of about 0.662 inch. A set screw 44 is secured to the upper end of the arbor 42 and extends through a central opening 43 in the plate member 32. The set screw 44 is adjustable and is used to determine the spacing of the stem base 14 with respect to the plate 32 prior to the crimping operation. A closure member 50 is secured to the lower portion of the collet holder 36 and includes a central opening 52 in which the shaft or arbor 42 is positioned and secured therein. The arbor 42 has an outwardly diverging surface at the upper end and adjacent to the plate 32 and provides a wedging surface 54.

A tubular collet assembly 60 is positioned about the arbor 42 and within the collet holder 36. The collet assembly 60 consists essentially of an internal collet 62 and an external collet 64. The collet assembly 60 is slidable within the sleeve 36 and on the arbor 42. The collet assembly 60 is comprised of the internal collet 62 and the external collet 64 which are integral to each other and are machined into opposing segments 63 and 65 respectively equal to the number of cavities 34. This is equal to the number of stem leads 12 in the stem 10. The collet assembly 60 is designed to provide equal motion for each of the segments 63 and 65 of the internal and external collets 62 and 64. This is accomplished by the upper end of the segments 63 of the internal collet 62 having a tapered surface bearing against the wedging surface 54 and the upper portion of the segments 65 and external collet 64 having a tapered surface bearing against the wedging surface 40. To assure identical motion for each collet segment 63 and 65 toward the stem pin-circle, all angles for wedging surfaces 40 and 54 must be identical and in line in the final assembly. The tapered surfaces on segments 63 and 65 must also be identical, and in line in the final assembly. The upper end of the inner segments 63 are out turned toward the outer segments 64 and the upper end of the outer segments 65 are in turned toward the inner segments 63 to provide opposed crimping surfaces 67. Each of the segments 63 and 65 of the collet assembly 60 is identically profiled as to its crimping surface 67 to provide a wrap form type crimp for each eyelet 22 joined to the stem lead 12 as shown in FIG. 2. In this manner, one can consistently join the eyelet members 22 to the lead member 12 with minimum force and minimum danger of damage to the stem 10. The crimping surfaces 67 comprise a central recess surface 69 and outer land surface 71.

An actuating means 70 for activating the collet assembly 60 is comprised of a piston like member 72 mounted within a sleeve member 74 and having projecting driving pins 76 which project through openings 78 in the member 50 to engage the lower portion of the collet assembly 60. A tapered wedge drive 80 moving in a horizontal direction and to the left as illustrated in FIG. 3, forces the collet assembly 60 upward. This causes the segments 63 of the inner collet member 62 to move outwardly and the segments 65 of the outer collet 64 to move inwardly to crimp the crimping portion 24 of the eyelet 22 into the stem lead 12 as illustrated in FIG. 2. The tapered wedge 80 is provided with suitable drive such as pneumatic means to accurately actuate the collet assembly 60. A one half inch horizontal movement of the member 80 provides about 0.010 vertical motion of the collet assembly 60. The maximum vertical motion cannot exceed 0.030 thus preventing any possible damage to the assembly due to oversetting.

The apparatus is designed to allow easy changeover for stems of different pin circles and number of lead and eyelet sizes. This is done by changing the plate 32 and the collet assembly 60. The adjustable stop 44 provides means of determining the spacing of the eyelet 22 from the boss 18 and also equalizes this spacing about the entire pin circle. The invention has only been shown in one form wherein the eyelets 22 are joined to the stem leads 12 in a form crimp principle. The system and design will allow several layers of eyelets 22 to be joined onto one or more of the stem leads 12 if so desired. It is also almost impossible to deform the skirt portion 26 of the eyelet 22 during the operation. In addition to a substantial cost savings over present methods utilized in the industry, it is also found that less material displacement occurs in the stem leads 12 and a change of grain structure of the stem lead 12 in subsequent processing is not experienced. It is found that the eyelet 22 does not experience any looseness due to differences in coefficients of thermal expansion of the elements when heated to temperatures of about 1,300°C.

It is obvious that the system may be easily modified cut or form a number of elements simultaneously. It is also possible to modify the design to provide welding. This could be accomplished by insulating the internal collet 62 from the external collet and applying proper potentials.

I claim:

1. An apparatus for assembling a plurality of eyelet members to a stem lead assembly in which said stem lead assembly comprises a plurality of stem leads and in which at least one of said eyelet members is threaded onto and secured to selected stem leads, said apparatus comprising a plate member having a first and second surface and having a first and a second group of cavities on said first surface, said first group of cavities adapted to provide a passage for one of said selected stem leads and also position one of said eyelet members, said first group of cavities permitting a portion of said eyelet member to extend beyond said second surface, said second group of cavities adapted to provide a passage for said stem leads and means provided adjacent to said second surface of said plate to secure one of said eyelet members to one of said stem leads passing through one of said first group of cavities.

2. The apparatus set forth in claim 1 in which said plate member is provided with orientation guides connected to said first group of openings to permit loading of said eyelet members into said first group of cavities.

3. The apparatus set forth in claim 1 in which said securing means is a form crimping means, said form crimping means comprising a pair of collet members positioned adjacent to said second surface of said plate member and means for forcing said pair of collet members toward each other to engage a portion of said eyelet member and form crimp it to said stem lead.

4. The apparatus set forth in claim 3 in which a stop member is provided to position said stem lead assembly with respect to said plate member.

5. The apparatus set forth in claim 1 in which said stem leads lie in a circle and in which said securing means is a form crimping means, said form crimping means comprising an inner circular collet member and an outer circular collet member, each of said collet members comprising a plurality of collet segments so that a pair of collet segments, one segment from said inner collet and one segment from said outer collet, is associated with each of said first group of cavities and means for forcing said inner collet segment outwardly and said outer collet segment inwardly to engage said eyelet members therebetween to form crimp said eyelet members to said selected stem leads.

6. An apparatus for securing a plurality of assemblies simultaneously, each of said assemblies comprising a tubular member positioned about an elongated member, said apparatus comprising a plate member having a plurality of locating means provided on a first surface and in which one of said tubular members is positioned and supported within each of said locating means, each of said locating means permitting a portion of said tubular member to extend through said plate and beyond a second surface of said plate member and also allowing said elongated member to pass through the tubular member positioned therein, and means provided adjacent said second surface for securing said tubular members to said elongated members simultaneously.

* * * * *